United States Patent
Kamei

(10) Patent No.: US 10,611,866 B2
(45) Date of Patent: Apr. 7, 2020

(54) NORBORNENE CROSS-LINKED POLYMER AND METHOD FOR PRODUCING SAME

(71) Applicant: RIMTEC CORPORATION, Tokyo (JP)

(72) Inventor: Nobuto Kamei, Tokyo (JP)

(73) Assignee: RIMTEC CORPORATION, Tokyo (JP)

(*) Notice: Subject to any disclaimer, the term of this patent is extended or adjusted under 35 U.S.C. 154(b) by 3 days.

(21) Appl. No.: 16/266,378

(22) Filed: Feb. 4, 2019

(65) Prior Publication Data

US 2019/0169329 A1 Jun. 6, 2019

Related U.S. Application Data

(62) Division of application No. 16/030,444, filed on Jul. 9, 2018, which is a division of application No. 15/025,113, filed as application No. PCT/JP2014/074772 on Sep. 19, 2014, now abandoned.

(30) Foreign Application Priority Data

Sep. 27, 2013 (JP) .................... 2013-201679

(51) Int. Cl.
| | | |
|---|---|---|
| C08F 132/08 | (2006.01) | |
| C08G 61/08 | (2006.01) | |
| H01L 23/29 | (2006.01) | |

(52) U.S. Cl.
CPC ............ *C08F 132/08* (2013.01); *C08G 61/08* (2013.01); *H01L 23/293* (2013.01); *C08G 2261/135* (2013.01); *C08G 2261/3324* (2013.01); *C08G 2261/3325* (2013.01); *C08G 2261/418* (2013.01); *C08G 2261/592* (2013.01); *C08G 2261/65* (2013.01); *C08G 2261/76* (2013.01)

(58) Field of Classification Search
None
See application file for complete search history.

(56) References Cited

U.S. PATENT DOCUMENTS

| | | | |
|---|---|---|---|
| 5,268,232 A | 12/1993 | Khasat et al. | |
| 2005/0043541 A1 | 2/2005 | Walter et al. | |
| 2005/0209400 A1* | 9/2005 | Tsumura | C08F 8/42 525/100 |
| 2009/0156735 A1 | 6/2009 | Koeniger et al. | |
| 2010/0048805 A1* | 2/2010 | Nakabayashi | G02B 1/04 524/570 |

FOREIGN PATENT DOCUMENTS

| | | |
|---|---|---|
| EP | 0 385 556 A2 | 9/1990 |
| JP | H06-25394 A | 2/1994 |
| JP | H07-188396 A | 7/1995 |
| JP | 2004-352896 A | 12/2004 |
| JP | 2010-229166 | * 10/2010 |
| JP | 2010-229166 A | 10/2010 |
| JP | 2013-256632 A | 12/2013 |
| WO | 2011-079799 A1 | 7/2011 |

OTHER PUBLICATIONS

JP 2010-229166, machine translation, Oct. 2010.*
Translation of Written Opinion dated Dec. 16, 2014, issued in counterpart Inernational Patent Application No. PCT/JP2014/074772 (Form PCT/ISA/237, with English translation. (5 pages).
International Search Report on Patentability (ISR) (Form PCT/ISA/210) dated Dec. 16, 2014, issued in International Patent Application No. PCT/JP2014/074772. (1 page).
Extended (supplementary) European Search Report dated Mar. 24, 2017, issued in counterpart European Patent Application No. 14849140.0. (7 pages).
Eun-Seok Park, et al., "Ringing-Opening Metathesis Polymerization of Dicyclopentadiene and Tricylopentadiene", Macromolecular Research, vol. 21, No. 1, 2013, pp. 114-117. Cited in the Extended (supplementary) European Search Report dated Mar. 24, 2017.

* cited by examiner

*Primary Examiner* — Hui H Chin
(74) *Attorney, Agent, or Firm* — Westerman, Hattori, Daniels & Adrian, LLP

(57) ABSTRACT

The present invention relates to a norbornene-based cross-linked polymer containing at least one member selected from the group consisting of dicyclopentadiene-based monomer units, tetracyclododecene-based monomer units, and tricyclopentadiene-based monomer units in an amount of 50% by mass or more, wherein the norbornene-based crosslinked polymer has a glass transition temperature of 240° C. or higher. Further, the present invention relates to a method for producing a norbornene-based crosslinked polymer as defined above, including step (1): heating a blend containing at least one member of the above monomer components, and a metathesis polymerization catalyst to a temperature lower than a deactivation temperature of the metathesis polymerization catalyst to carry out a primary curing; and step (2): heating a cured product obtained in the step (1) to a temperature equal to or higher than the deactivation temperature of the above metathesis polymerization catalyst to carry out a secondary curing.

6 Claims, No Drawings

NORBORNENE CROSS-LINKED POLYMER AND METHOD FOR PRODUCING SAME

CROSS-REFERENCE TO RELATED APPLICATIONS

This application is a Divisional of U.S. application Ser. No. 16/030,444 filed on Jul. 9, 2018, which is a Divisional of U.S. application Ser. No. 15/025,113 filed on Mar. 25, 2016, now abandoned, which is a 371 of PCT/JP2014/074772 filed on Sep. 19, 2014, which claims priority over Japanese Application No. 2013-201679 filed on Sep. 27, 2013, the entire contents of which is incorporated herein by reference.

TECHNICAL FIELD

The present invention relates to a norbornene-based cross-linked polymer having excellent heat resistance and a method for producing the same.

BACKGROUND ART

High-heat-resistant resins are suitably used in applications that require high heat resistance, such as applications of engine covers for automobiles or the like, and electric insulation applications such as encapsulation materials for power semiconductors.

Polymers of cyclic olefins such as norbornenes are generally excellent in heat resistance, and as the techniques of producing a norbornene-based crosslinked polymer having even more improved heat resistance, for example, a method using a given norbornene-based monomer having a polar group (Patent Publication 1) or a method using a given metathesis catalyst (Patent Publication 2) has been proposed. However, there are still rooms for improvements in heat resistance of the polymers obtained.

PRIOR ART REFERENCES

Patent Publications

Patent Publication 1: Japanese Patent Laid-Open No. Hei-6-25394
Patent Publication 2: Japanese Patent Laid-Open No. 2004-352896

SUMMARY OF THE INVENTION

Problems to be Solved by the Invention

Accordingly, an object of the present invention is to provide a norbornene-based crosslinked polymer having super-high heat resistance and a method for efficiently producing the same.

Means to Solve the Problems

Specifically, the gist of the present invention relates to:
[1] a norbornene-based crosslinked polymer containing at least one member selected from the group consisting of dicyclopentadiene-based monomer units, tetracyclododecene-based monomer units, and tricyclopentadiene-based monomer units in an amount of 50% by mass or more, wherein the norbornene-based crosslinked polymer has a glass transition temperature of 240° C. or higher; and

[2] a method for producing a norbornene-based crosslinked polymer as defined in the above [1], including
step (1) heating a blend containing at least one member selected from the group consisting of dicyclopentadiene-based monomers, tetracyclododecene-based monomers, and tricyclopentadiene-based monomers, and a metathesis polymerization catalyst to a temperature lower than a deactivation temperature of the above metathesis polymerization catalyst to carry out a primary curing; and
step (2) heating a cured product obtained in the step (1) to a temperature equal to or higher than the deactivation temperature of the above metathesis polymerization catalyst to carry out a secondary curing.

Effects of the Invention

The norbornene-based crosslinked polymer of the present invention exhibits an effect of showing super-high heat resistance that its glass transition temperature is 240° C. or higher.

MODES FOR CARRYING OUT THE INVENTION

The norbornene-based crosslinked polymer of the present invention refers to a polymer containing at least one member selected from the group consisting of dicyclopentadiene-based monomer units, tetracyclododecene-based monomer units, and tricyclopentadiene-based monomer units in an amount of 50% by mass or more, wherein the norbornene-based crosslinked polymer has a glass transition temperature (Tg) of 240° C. or higher.

In the present invention, the dicyclopentadiene-based monomer units, the tetracyclododecene-based monomer units, and the tricyclopentadiene-based monomer units refer to units obtained by ring-opening polymerization of each of the monomers.

In the present invention, the dicyclopentadiene-based monomer refers to dicyclopentadiene, or a tricyclic compound in which a part of hydrogen in the structure of dicyclopentadiene is substituted with a substituent. The tetracyclododecene-based monomer refers to tetracyclododecene, or a tetracyclic compound in which a part of hydrogen in the structure of tetracyclododecene is substituted with a substituent. The tricyclopentadiene-based monomer refers to tricyclopentadiene, or a pentacyclic compound in which a part of hydrogen in the structure of tricyclopentadiene is substituted with a substituent.

These monomers may have a substituent such as an alkyl having from 1 to 5 carbon atoms, such as a methyl group, an ethyl group, a propyl group, or a butyl group; an alkenyl group having from 2 to 5 carbon atoms, such as a vinyl group; an alkylidene group having from 1 to 5 carbon atoms, such as an ethylidene group; an aryl group having from 6 to 10 carbon atoms, such as a phenyl group, a tolyl group, or a naphthyl group.

Further, these monomers may have, as a substituent, a polar group, such as a hydroxyl group, an ester group (—C(O)O—), an ether group (—O—), an epoxy group, a cyano group, or a halogen atom.

Especially, if the monomer used has a polar group such as a hydroxyl group, an epoxy group, or a cyano group, when the norbornene-based crosslinked polymer of the present invention is used, for example, as encapsulation materials for power semiconductors, it is preferable because adhesion to semiconductor elements to be encapsulated is improved, and insulation performance is sufficiently exhibited.

Specific examples of the dicyclopentadiene-based monomers include dicyclopentadiene, 2-methyldicyclopentadiene, 2,3-dimethyldicyclopentadiene, 2,3-dihydroxydicyclopentadiene, dicyclopentadiene monoepoxide, vinylnorbornene, and 5-ethylidenenorbornene, and the like.

Specific examples of the tetracyclododecene-based monomers include tetracyclododecene, ethylidene tetracyclododecene, and methanotetrafluorofluorene, and the like.

Specific examples of the tricyclopentadiene-based monomers include 3a,4,4a,5,8,8a,9,9a-octahydro-4,9:5,8-dimethano-1H-benzo[f]indene and 1,4:4a,4b,5,8,8a,9a-octahydro-1,4:5,8-dimethano-1H-fluorene (these trivial names are all tricyclopentadiene), and tricyclopentadiene monoepoxide, and the like.

As the monomer usable in the present invention, since a polymer with low hygroscopicity and high strength is obtained, dicyclopentadiene, tetracyclododecene, 3a,4, 4a,5, 8,8a,9,9a-octahydro-4,9:5,8-dimethano-1H-benzo[f]indene, and 1,4:4a,4b,5,8,8a, 9a-octahydro-1,4:5,8-dimethano-1H-fluorene are especially preferred.

The above monomers are used alone or in a combination of two or more kinds.

The norbornene-based crosslinked polymer of the present invention contains at least one member selected from the group consisting of dicyclopentadiene-based monomer units, tetracyclododecene-based monomer units, and tricyclopentadiene-based monomer units in an amount of 50% by mass or more. The content of the at least one member is preferably from 60 to 100% by mass, and more preferably from 70 to 100% by mass, from the viewpoint of even more improving heat resistance of the polymer.

Among them, as the norbornene-based crosslinked polymer of the present invention, the norbornene-based crosslinked polymers containing tricyclopentadiene-based monomer units in an amount of preferably 50% by mass or more, more preferably from 60 to 100% by mass, and especially preferably from 70 to 100% by mass are preferred, from the viewpoint of improving heat resistance and insulation property in good balance.

The norbornene-based crosslinked polymer of the present invention is produced by, for example, a method for production described later, and bubbles may be generated during the polymerization reaction, and the bubbles may be contained in the polymer obtained. When bubbles exist in the polymer, insulation property thereof would be lowered. Surprisingly, when a polymerization reaction is carried out using a blend containing tricyclopentadiene-based monomers in a large amount, the generation of bubbles is suppressed. Among the polymers obtained in the manner described above, especially the norbornene-based crosslinked polymer of the present invention that contains tricyclopentadiene-based monomer units in the above range does not substantially contain any bubbles, so that it is assumed that heat resistance and insulation property are improved in good balance.

Here, the norbornene-based crosslinked polymer of the present invention may contain other monomer units of monomers copolymerizable with the dicyclopentadiene-based monomers, the tetracyclododecene-based monomers, or the tricyclopentadiene-based monomers, in addition to the dicyclopentadiene-based monomer units, the tetracyclododecene-based monomer units, or the tricyclopentadiene-based monomer units. The content of the other monomer units is preferably 40% by mass or less, more preferably 10% by mass or less, and even more preferably 5% by mass or less, from the viewpoint of maintaining high heat resistance. The other monomers include, for example, cyclic olefins in monocyclic form, such as cyclobutene, cyclopentene, cyclopentadiene, cyclohexene, cycloheptene, cyclooctene, and cyclododecene.

The norbornene-based crosslinked polymer of the present invention is obtained, as described later, by subjecting at least one member selected from the group consisting of dicyclopentadiene-based monomers, tetracyclododecene-based monomers, and tricyclopentadiene-based monomers mentioned above to a bulk ring-opening polymerization together with crosslinking. The glass transition temperature (Tg) of the polymer is 240° C. or higher, which is very high as compared to the conventional norbornene-based crosslinked polymer. Conventionally, when norbornene-based monomers are subjected to bulk ring-opening polymerization, sufficient crosslinking is caused together with the polymerization reaction, and heating after the polymerization is considered to have no merits at all only degrading the polymer obtained. Meanwhile, surprisingly, it is assumed that crosslinking even more progresses by further heating a polymer obtained at a given temperature, whereby a norbornene-based crosslinked polymer having an unexpectedly high glass transition temperature is obtained. The glass transition temperature of the norbornene-based crosslinked polymer of the present invention is preferably 250° C. or higher, and more preferably 270° C. or higher. Here, the glass transition temperature is the higher the more preferred, and the upper limit thereof is usually 330° C. or so.

Here, the glass transition temperature of the norbornene-based crosslinked polymer of the present invention can be obtained with a dynamic mechanical analyzer (DMA) in a tensile mode by measuring a tan δ under the conditions of a heating rate of 5° C./min from room temperature, and a measurement frequency of 1 Hz, and determining a temperature at which tan δ takes a maximal value. As the above instrument, for example, one manufactured by Seiko Instruments Inc. under the product name of "DMS 6100" can be used.

The norbornene-based crosslinked polymer of the present invention is suitably used as an insulation material. Especially, the norbornene-based crosslinked polymer containing tricyclopentadiene-based monomer units in an amount of 50% by mass or more usually has a one-minute withstand voltage at a measurement temperature of 23° C. of 60 kV/mm or more, and preferably 70 kV/mm or more, so that the norbornene-based crosslinked polymer not only has high-heat resistance but also excellent insulation property, so that it is highly suitably used, for example, as encapsulation materials for power semiconductors. The upper limit of the one-minute withstand voltage is usually 100 kV/mm or so.

Here, the one-minute withstand voltage can be obtained in accordance with a method described in Examples given later.

The norbornene-based crosslinked polymer of the present invention can be efficiently produced by a method including step (1) heating a blend containing at least one member selected from the group consisting of dicyclopentadiene-based monomers, tetracyclododecene-based monomers, and tricyclopentadiene-based monomers mentioned above, and a metathesis polymerization catalyst to a temperature lower than a deactivation temperature of the above metathesis polymerization catalyst to carry out a primary curing; and step (2) heating a cured product obtained in the step (1) to a temperature equal to or higher than the deactivation temperature of the above metathesis polymerization catalyst to carry out a secondary curing. Here, the blend may contain other monomers mentioned above.

The blend usable in the step (1) contains a metathesis polymerization catalyst together with the above monomer components.

As mentioned above, in the norbornene-based crosslinked polymer of the present invention which contains the tricyclopentadiene-based monomer units in an amount of 50% by mass or more, heat resistance and insulation property are improved in good balance. As the above blend, one containing the tricyclopentadiene-based monomers usually in an amount of 50% by mass or more, preferably from 60 to 100% by mass, and more preferably from 70 to 100% by mass, of the entire monomers contained therein, are preferably used, from the viewpoint of efficiently producing the polymer. Here, the composition of each of the monomers contained in the blend and the composition of each of the monomer units in the norbornene-based crosslinked polymer obtained are substantially the same.

The metathesis polymerization catalyst usable in the present invention is a complex composed of a transition metal atom as a center atom and plural ions, atoms, multiatomic ions, and/or compounds bound thereto. As the transition metal atom, the atoms of Groups 5, 6 and 8 (Long-period type Periodic Table, hereinafter referred to the same) are used. Although the atoms of each of the Groups are not particularly limited, the atoms of Group 5 include, for example, tantalum, the atoms of Group 6 include, for example, molybdenum and tungsten, and the atoms of Group 8 include, for example, ruthenium and osmium. Among these transition metal atoms, ruthenium and osmium of Group 8 are preferred. In other words, the metathesis polymerization catalyst used in the present invention is preferably a complex with ruthenium or osmium as a center atom, and more preferably a complex with ruthenium as a center atom. As the complex with ruthenium as a center atom, a ruthenium-carbene complex composed of ruthenium and carbene compounds coordinated thereto is preferred. Here, the term "carbene compound" collectively refers to compounds having a methylene free radical, which are compounds having a divalent carbon atom (carbene carbon) that is not electrically charged, as represented by (>C:). Since the ruthenium-carbene complex has excellent catalytic activity upon the bulk ring-opening polymerization, the polymer obtained has less odor originated from unreacted monomers, so that a high-quality polymer is obtained with excellent productivity. In addition, the complex is relatively stable against oxygen or water in the air, and is less likely to be deactivated, so that the complex can be used in the air.

The ruthenium-carbene complex includes a complex represented by the following general formula (1) or general formula (2).

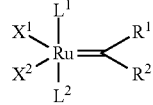
(1)

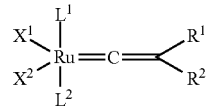
(2)

In the above general formulas (1) and (2), each of $R^1$ and $R^2$ is independently a hydrogen atom; a halogen atom; or an organic group having from 1 to 20 carbon atoms, which may contain a halogen atom, an oxygen atom, a nitrogen atom, a sulfur atom, a phosphorus atom or a silicon atom, and these groups may have a substituent, or may be bound to each other to form a ring. Examples of $R^1$ and $R^2$ that are bound to each other to form a ring include an indenylidene group which may have a substituent, such as a phenylindenylidene group.

Specific examples of the organic group having from 1 to 20 carbon atoms which may contain a halogen atom, an oxygen atom, a nitrogen atom, a sulfur atom, a phosphorus atom, or a silicon atom include an alkyl group having from 1 to 20 carbon atoms, an alkenyl group having from 2 to 20 carbon atoms, an alkynyl group having from 2 to 20 carbon atoms, an aryl group having from 6 to 20 carbon atoms, an alkoxy group having from 1 to 20 carbon atoms an alkenyloxy group having from 2 to 20 carbon atoms, an alkynyloxy group having from 2 to 20 carbon atoms, an aryloxy group having from 6 to 20 carbon atoms, an alkylthio group having from 1 to 8 carbon atoms, a carbonyloxy group, an alkoxycarbonyl group having from 1 to 20 carbon atoms, an alkylsulfonyl group having from 1 to 20 carbon atoms, an alkylsulfinyl group having from 1 to 20 carbon atoms, an alkylsulfonic acid group having from 1 to 20 carbon atoms, an arylsulfonic acid group having from 6 to 20 carbon atoms, a phosphonic acid group, an arylphosphonic acid group having from 6 to 20 carbon atoms, an alkylammonium group having from 1 to 20 carbon atoms, and an arylammonium group having from 6 to 20 carbon atoms, and the like. These organic groups having from 1 to 20 carbon atoms which may contain a halogen atom, an oxygen atom, a nitrogen atom, a sulfur atom, a phosphorus atom, or a silicon atom may have a substituent. Examples of the substituent include an alkyl group having from 1 to 10 carbon atoms, an alkoxy group having from 1 to 10 carbon atoms, and an aryl group having from 6 to 10 carbon atoms, and the like.

Each of $X^1$ and $X^2$ is independently any anionic ligand. The anionic ligand refers to a ligand having a negative electric charge when separated from a center metal atom, and includes, for example, a halogen atom, a diketonate group, a substituted cyclopentadienyl group, an alkoxyl group, an aryloxy group, a carboxyl group, and the like.

$L^1$ and $L^2$ stand for a heteroatom-containing carbene compound or a neutral electron donating compound other than the heteroatom-containing carbene compound. The heteroatom-containing carbene compound and the neutral electron donating compound other than the heteroatom-containing carbene compound are compounds having neutral electric charges when separated from the center metal. The heteroatom containing-carbene compound is preferred, from the viewpoint of improving catalytic activity. The heteroatom means atoms of Groups 15 and 16 of the Periodic Table, and specific examples include a nitrogen atom, an oxygen atom, a phosphorus atom, a sulfur atom, an arsenic atom, a selenium atom, and the like. Among them, a nitrogen atom an oxygen atom, a phosphorus atom, and a sulfur atom are preferred, and a nitrogen atom is especially preferred, from the viewpoint of obtaining a stable carbene compound.

As the above heteroatom-containing carbene compound, a compound represented by the following general formula (3) or (4) is preferred, and the compound represented by the following general formula (3) is especially preferred, from the viewpoint of improving catalytic activity.

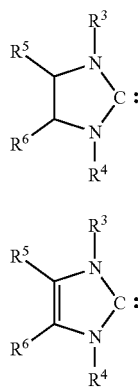

(3)

(4)

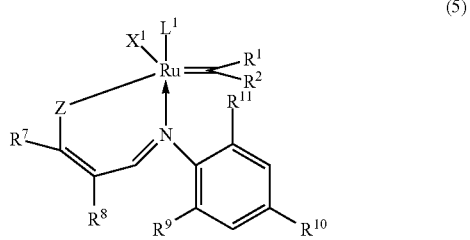

(5)

The general formula (5) is given hereinbelow.

In the above general formulas (3) and (4), each of $R^3$, $R^4$, $R^5$ and $R^6$ stands for independently a hydrogen atom; a halogen atom; or an organic group having from 1 to 20 carbon atoms which may have a halogen atom, an oxygen atom, a nitrogen atom, a sulfur atom, a phosphorus atom, or a silicon atom. Specific examples of the organic group having from 1 to 20 carbon atoms which may have a halogen atom, an oxygen atom, a nitrogen atom, a sulfur atom, a phosphorus atom, or a silicon atom are the same as those cases for the above general formulas (1) and (2).

Alternatively, $R^3$, $R^4$, $R^5$ and $R^6$ may be bound to each other in any combinations to form a ring.

Here, in order to make the effects of the present invention more remarkable, it is preferable that $R^5$ and $R^6$ are hydrogen atoms. In addition, $R^3$ and $R^4$ are preferably aryl groups which may have a substituent, and the substituent is more preferably a phenyl group having an alkyl group having from 1 to 10 carbon atoms, and especially preferably a mesityl group.

The above neutral electron donating compound includes, for example, an oxygen atom, water, carbonyls, ethers, nitriles, esters, phosphines, phosphinites, phosphites, sulfoxides, thioethers, amides, imines, aromatics, cyclic diolefins, olefins, isocyanides, and thiocyanates, and the like.

In the above general formula (1) and (2), each of $R^1$, $R^2$, $X^1$, $X^2$, $L^1$ and $L^2$ may be bound solely, and/or bound to each other in any combinations to form a polydentate chelating ligand.

In addition, as the ruthenium-carbene complex used in the present invention, among the compounds represented by the above general formula (1) or (2), the compound represented by the above formula (1) is preferred from the viewpoint of improving heat resistance and insulation property of the norbornene-based crosslinked polymer of the present invention in good balance. Among them, a compound represented by the general formula (5) or the general formula (6) given below is more preferred. By using the compound as a metathesis polymerization catalyst, the polymerization reaction appropriately progresses, so that the generation of bubbles is suppressed, so that it is assumed that heat resistance and insulation property of the norbornene-based crosslinked polymer of the present invention are improved in good balance.

In the above general formula (5), Z is an oxygen atom, a sulfur atom, a selenium atom, $NR^{12}$, $PR^{12}$ or $AsR^{12}$, wherein $R^{12}$ is a hydrogen atom; a halogen atom; or an organic group having from 1 to 20 carbon atoms which may contain a halogen atom, an oxygen atom, a nitrogen atom, a sulfur atom, a phosphorus atom, or a silicon atom. Since the effects of the present invention are even more remarkable, it is preferable that Z is an oxygen atom.

Here, $R^1$, $R^2$, $X^1$ and $L^1$ are the same as defined in the cases of the above (1) and (2), which may be bound solely and/or may be bound to each other in any combinations to form a polydentate chelating ligand, and it is preferable that $X^1$ and $L^1$ do not form a polydentate chelating ligand, and that $R^1$ and $R^2$ are bound to each other to form a ring, more preferably an indenylidene group which may have a substituent, and especially preferably a phenylindenylidene group.

In addition, specific examples of the organic group having from 1 to 20 carbon atoms which may contain a halogen atom, an oxygen atom, a nitrogen atom, a sulfur atom, a phosphorus atom, or a silicon atom are the same as the cases of the above general formulas (1) and (2).

In the above general formula (5), each of $R^7$ and $R^8$ is independently a hydrogen atom, an alkyl group having from 1 to 20 carbon atoms, an alkenyl group having from 2 to 20 carbon atoms, or a heteroaryl group having from 6 to 20 carbon atoms, and these groups may have a substituent, or may be bound to each other to form a ring. Examples of the substituent include an alkyl group having from 1 to 10 carbon atoms, an alkoxy group having from 1 to 10 carbon atoms, or an aryl group having from 6 to 10 carbon atoms. The ring when a ring is formed may be any of aromatic rings, alicyclic rings, and heterocyclic rings. It is preferable that an aromatic ring is formed, it is more preferable that an aromatic ring having from 6 to 20 carbon atoms is formed, and it is even more preferable that an aromatic ring having 6 to 10 carbon atoms is formed.

In the above general formula (5), each of $R^9$, $R^{10}$, and $R^{11}$ is independently a hydrogen atom; a halogen atom; or an organic group having from 1 to 20 carbon atoms which may contain a halogen atom, an oxygen atom, a nitrogen atom, a sulfur atom, a phosphorus atom, or a silicon atom, and these groups may have a substituent, or may be bound to each other to form a ring. In addition, specific examples of the organic group having from 1 to 20 carbon atoms which may contain a halogen atom, an oxygen atom, a nitrogen atom, a sulfur atom, a phosphorus atom, or a silicon atom are the same as the cases of the above general formulas (1) and (2).

It is preferable that $R^9$, $R^{10}$ and $R^{11}$ are a hydrogen atom or an alkyl group having from 1 to 20 carbon atoms, and especially preferably a hydrogen atom or an alkyl group having from 1 to 3 carbon atoms.

Here, specific examples of the compound represented by the above general formula (5) and production methods thereof include those described in, for example, WO 03/062253 (Japanese Unexamined Patent Publication No. 2005-515260), and the like. The catalyst deactivation temperature of the compound is usually 230° C. or lower.

The general formula (6) is given hereinbelow.

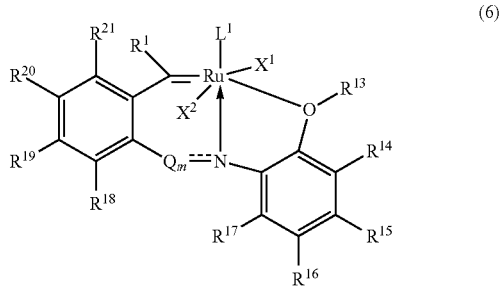

(6)

In the above general formula (6), in is 0 or 1. in is preferably 1, and in that case Q is an oxygen atom, a nitrogen atom, a sulfur atom, a methylene group, an ethylene group, or a carbonyl group, and preferably a methylene group. ---- is a single bond or a double bond, and preferably a single bond.

$R^1$, $X^1$, $X^2$ and $L^1$ are the saute as the cases of the above general formulas (1) and (2), each of which may be bound solely and/or may be bound to each other in any combinations to form a polydentate chelating ligand. It is preferable that $X^1$, $X^2$ and $L^1$ do not form a polydentate chelating ligand, and that $R^1$ is a hydrogen atom.

Each of $R^{13}$ to $R^{21}$ is independently a hydrogen atom; a halogen atom; or an organic group having from 1 to 20 carbon atoms which may contain a halogen atom, an oxygen atom, a nitrogen atom, a sulfur atom; a phosphorus atom, or a silicon atom, and these groups may have a substituent, or may be bound to each other to form a ring. In addition, specific examples of the organic group having from 1 to 20 carbon atoms which may contain a halogen atom, an oxygen atom, a nitrogen atom, a sulfur atom, a phosphorus atom, or a silicon atom are the same as the cases of the above general formulas (1) and (2).

$R^{13}$ is preferably an alkyl group having from 1 to 20 carbon atoms, and more preferably an alkyl group having from 1 to 3 carbon atoms, $R^{14}$ to $R^{17}$ are preferably a hydrogen atom, and $R^{18}$ to $R^{21}$ are preferably a hydrogen atom or a halogen atom.

Here, specific examples of the compound represented by the above general formula (6) and production methods thereof include those described in, for example, WO 11/079799 (Japanese Unexamined Patent Publication No. 2013-516392), and the like. The catalyst deactivation temperature of the compound is usually 230° C. or lower.

The amount of the metathesis polymerization catalyst used is preferably 0.01 mmol or more, more preferably 0.1 to 50 mmol, and even more preferably from 0.1 to 20 mmol, per one mol of the entire monomers used in the reaction.

The blend may contain other components besides the above monomer components and the metathesis polymerization catalyst, and other components as mentioned above include activators, polymerization retardants, fillers, radical generators, modifiers, antioxidants, colorants, photostabilizers, flame retardants, and the like.

The activator is a compound that acts as a cocatalyst of the metathesis polymerization catalyst mentioned above to improve polymerization activity of the metathesis polymerization catalyst mentioned above. The activator as mentioned above is not particularly limited, and specific examples thereof include organoaluminum compounds such as alkylaluminum halides such as ethylaluminum dichloride and diethylaluminum chloride, and alkoxyalkylaluminum halides; organotin compounds such as tetrabutyltin; organozinc compounds such as diethylzinc; chlorosilane compounds such as dimethyl monochlorosilane, dimethyl dichlorosilane, diphenyl dichlorosilane, tetrachlorosilane, bicycloheptenylmethyl dichlorosilane, phenylmethyl dichlorosilane, dihexyl dichlorosilane, phenyl trichlorosilane, and methyl trichlorosilane, and the like.

The amount of the activator used is not particularly limited, and the amount used, based on one mol of the metathesis polymerization catalyst, is preferably 0.1 mol or more, and more preferably 1 mol or more, and the upper limit of the amount used is preferably 100 mol or less, and more preferably 20 mol or less. When the amount of the activator used is too small, the polymerization activity becomes too low, and the time required for the reaction becomes long, thereby lowering the production efficiency. On the contrary, when the amount used is too large, the reaction becomes exceedingly intense, so that a desired polymer is less likely to be obtained.

The polymerization retardant is purposed for suppressing an initiation of the polymerization during the preparation of the blend by mixing monomer components and a metathesis polymerization catalyst. The polymerization retardant as mentioned above includes phosphines, phosphites, vinyl ether derivatives, ethers, esters, nitrile compounds, pyridine derivatives, alcohols, acetylenes, and a-olefins, and the like.

The amount of the polymerization retardant used is not particularly limited, and the amount used is preferably 15 parts by mass or more and 5,000 parts by mass or less, more preferably from 15 to 1,800 parts by mass, more preferably from 50 to 900 parts by mass, and even more preferably from 150 to 500 parts by mass, based on 100 parts by mass of the metathesis polymerization catalyst.

The filler is not particularly limited, and includes, for example fibrous fillers having an aspect ratio of from 5 to 100, and particulate fillers having an aspect ratio of from 1 to 2. In addition, these fibrous fillers and particulate fillers can be used in combination.

Specific examples of the fibrous filler include glass fibers, carbon fibers, wollastonite, potassium titanate, zonolite, basic magnesium sulfate, aluminum borate, tetra-pod shaped zinc oxide, gypsum fibers, phosphate fibers, alumina fibers, acicular calcium carbonate, acicular boehmite, and the like. Among them, wollastonite is preferred, from the aspect of being capable of increasing rigidity with a small amount added and not inhibiting the bulk open-ring polymerization reaction.

Specific examples of the particulate filler include calcium carbonate, calcium hydroxide, calcium silicate, calcium sulfate, aluminum hydroxide, magnesium hydroxide, titanium oxide, zinc oxide, barium titanate, silica, alumina, carbon black, graphite, antimony oxide, red phosphorus, various metal powders, clays, various ferrites, hydrotalcite, and the like. Among them, silica, alumina, and aluminum hydroxide are preferred, because they do not inhibit the bulk ring-opening polymerization reaction.

In addition, it is preferable that the above filler is one of which surface is hydrophobically treated. By using a hydrophobically treated filler, the aggregation and sedimentation of the filler in the blend can be prevented, and the dispersion of the filler in the polymer obtained can be made homogeneous. The treatment agent used in the hydrophobic treatment includes silane coupling agents such as vinyltrimethoxysilane; titanate coupling agents, aluminate coupling agents, fatty acids such as stearic acid, fats and oils, surfactants, waxes, and the like. Here, the hydrophobic treatment of the filler can also be carried out by concurrently mixing the above treatment agent with the filler when the blend is prepared.

The amount of the filler blended in the blend is preferably from 10 to 1,000 parts by mass, and more preferably from 100 to 500 parts by mass, based on 100 parts by mass of the entire monomer component used. By having the amount of the filler blended in the above range, strength of the polymer obtained can be increased.

The radical generator includes organic peroxides, diazo compounds, and nonpolar radical generators, and the like that are known in the art. Among them, the organic peroxide is preferred.

The organic peroxide includes, for example, hydroperoxides such as t-butyl hydroperoxide and cumene hydroperoxide; dialkyl peroxides such as di-t-butyl peroxide, 2,5-dimethyl-2,5-di(t-butylperoxy)-3-hexyne, and 2,5-dimethyl-2,5-di(t-butylperoxy)hexane; and the like. The dialkyl peroxide is preferred, from the aspect that the impediment to the metathesis polymerization reaction is small.

The amount of the radical generator blended in the blend is usually from 0.5 to 2.0 parts by mass, based on 100 parts by mass of the entire monomer components used.

Other modifying agents and the like are also known in the art, which can be properly blended in a desired amount in the blend and used.

The blend can be prepared by mixing a metathesis polymerization catalyst, at least one member selected from the group consisting of dicyclopentadiene-based monomers, tetracyclododecene-based monomers, and tricyclopentadiene-based monomers, and optionally other monomers and/or other components, in accordance with a known method. Here, the blend may be in a solid form or a liquid form at room temperature, according to a melting point of the monomer components used.

In addition, the blend may be cooled and solidified. The term "cooled and solidified" means to solidify under cooling. The blend can be prepared, for example, in accordance with the following two methods.

In a first method, monomer components previously cooled to a temperature equal to or lower than a freezing point to give a solid form, a metathesis polymerization catalyst, and optionally added other components are mixed while cooling the mixture to a temperature at which the monomer components do not substantially melt, and the mixture obtained is subjected to pressure molding under cooling with, for example, a tableting machine or a press molding machine to allow cooling and solidification, to prepare a blend. Although the temperature at which each of the components is mixed depends on the monomer components used, it is preferable that the temperature is usually 25° C. or lower.

In a second method, liquid monomer components, a metathesis polymerization catalyst, and optionally added other components are mixed at a temperature in which a mixture obtained maintains a liquid state, and the mixture is allowed to cool and solidify utilizing, for example, a mold given later, before a bulk ring-opening polymerization of the monomer components is substantially progressed, to prepare a blend. Although the temperature at which each of the components is mixed depends on the monomer components used, it is preferable that the temperature is usually from 30° to 60° C.

Here, in both the methods, the cooling temperature when cooling and solidifying depends upon the monomer components used, it is preferable that the cooling temperature is usually from −60° to 0° C.

In the step (1), the blend is heated to a temperature lower than a deactivation temperature of the metathesis polymerization catalyst to carry out a primary curing. The deactivation temperature of the metathesis polymerization catalyst depends upon the kinds of individual catalyst, the deactivation temperature can be obtained by referring to the instruction manual of supplier, or experimentally. In addition, when plural metathesis polymerization catalysts are used, a catalyst with the lowest deactivation temperature would be the subject for the deactivation temperature. In the step (1), it is heated to preferably a temperature which is 10° C. lower, more preferably a temperature which is 20° C. lower, and even more preferably a temperature which is 30° C. lower, than the deactivation temperature of the metathesis polymerization catalyst used. Specific temperature ranges of the heating temperature in the step (1) are usually 25° C. or higher and lower than 220° C., preferably from 25° to 210° C., and more preferably from 60° to 200° C. The heating time for primary curing is usually from one second to 20 minutes, and preferably from 10 seconds to 5 minutes.

When the blend is subjected to primary curing, not only the monomer components are subjected to bulk ring-opening polymerization, but also crosslinking reaction progresses, thereby obtaining a cured product.

In the step (1), the method for carrying out a primary curing of a blend is not limited, and the method includes, for example, (a) a method including coating a support with a blend, and then carrying out a bulk ring-opening polymerization; (b) injecting or placing a blend to a space portion of a mold, and then carrying out a bulk ring-opening polymerization; (c) impregnating a blend to a fibrous reinforcing material, and then carrying out a bulk ring-opening polymerization; and the like.

According to the method of (a), a cured product in the form of a film, a plate, or the like is obtained. The thickness of the cured product is usually 15 mm or less, preferably 10 mm or less, and more preferably 5 mm or less.

The support includes, for example, films and plates made of resins such as polyethylene terephthalate, polypropylene, polyethylene, polycarbonate, polyethylene naphthalate, polyarylate, and nylon; films and plates made of metal materials such as iron, stainless steel, copper, aluminum, nickel, chromium, gold, and silver, and the like. Among them, the use of resin films or metal foils is preferred. The thickness of these resin films or metal foils is usually from 1 to 150 μm, preferably from 2 to 100 μm, and more preferably from 3 to 75 μm, from the viewpoint of workability or the like.

The method for coating a support with a blend includes known coating methods such as a spray-coating method, a dip coating method, a roller coating method, a curtain coating method, a die coating method, and a slit coating method.

The blend coated to a support is dried as desired, and thereafter heated to carry out a bulk ring-opening polymerization. The heating method includes a method of placing on a hot plate a support coated with the blend, and heating the blend; a method of heating a blend while applying pressure with a press machine (hot pressing); a method of applying pressure with a heated roller; a method of using a heated furnace; and the like.

The shape of the cured product obtained according to a method of (b) can be optionally set depending upon a mold. For example, the shape includes, films, pillars, and any other three-dimensional shapes.

In this method, it is preferable that the blend can be prepared by the following two methods, depending upon whether or not a metathesis polymerization catalyst used would need an activator (cocatalyst).

Specifically, in a case where a metathesis polymerization catalyst to be used does not require an activator, a pre-blend (i) containing monomer components and a pre-blend (ii) containing a metathesis polymerization catalyst may be mixed. The pre-blend (ii) can be prepared by, for example, dissolving or dispersing a metathesis polymerization catalyst in a small amount of a proper solvent. The solvent includes, for example, aromatic hydrocarbons such as toluene, xylene, ethylbenzene, and trimethylbenzene; ketones such as methyl ethyl ketone, cyclopentanone, cyclohexanone, 2-heptanone, and 4-hydroxy-4-methyl-2-pentanone, and the like.

On the other hand, in a case where a metathesis polymerization catalyst requires an activator, a pre-blend containing monomer components and a metathesis polymerization catalyst (hereinafter referred to "Liquid A" in some cases), and a pre-blend containing monomer components and an activator (hereinafter referred to "Liquid B" in some cases) may be mixed. During the mixing, a pre-blend composed only of the monomer components (hereinafter referred to "Liquid C" in some cases) may be used together.

Here, when other components are to be blended, the components can be blended with of any pre-blends.

The method including injecting or placing a blend to a space portion of a mold, and thereafter subjecting the blend to bulk ring-opening polymerization include, for example, an RIM molding method, an RTM method, a potting method, a (solid, liquid) transfer molding method, a compression molding method, a printing molding method, a vacuum injection method, and the like. An RIM molding method suitably used when a blend is a liquid will be explained hereinbelow.

In the RIM molding method, in order to allow bulk ring-opening polymerization of a blend in a mold, usually, as a reaction injection molding (RIM) apparatus, a known collision mixing apparatus is used. In the collision mixing apparatus, when two or more pre-blends mentioned above [a pre-blend (i) and a pre-blend (ii), or "Liquid A," "Liquid B," and "Liquid C"] are separately introduced, the components are instantly mixed with a mixing head to prepare a blend, and this blend is directly injected into a mold, and heated in the mold to cause a bulk ring-opening polymerization to prepare a cured product. Here, a low-pressure injection machine such as a dynamic mixer or a static mixer can be also used, in place of the collision mixing apparatus The above mold is not particularly limited, and it is preferable to use usually the molds in the form of a split mold structure comprising a core mold and a cavity mold. In addition, the mold used is not necessarily an expensive mold having high rigidity, and a mold made of a resin can be used. The materials of the mold are not particularly limited, and the materials include steel, aluminum, zinc alloys, nickel, copper, chromium, and the like, which may be produced by any of methods such as casting, forging, metallizing, and electroforming, and those that are plated may be also used.

The temperature of the mold is preferably from 10° to 150° C., more preferably from 30° to 120° C., and even more preferably from 50° to 100° C. The mold clamping pressure is usually within the range of from 0.01 to 10 MPa. The time of the bulk ring-opening polymerization may be properly selected, and after the termination of injection of the pre-blend, the time is usually from one second to 20 minutes, and preferably from 10 seconds to 5 minutes.

After the termination of the bulk ring-opening polymerization, the mold is unclamped to demold, whereby a cured product can be obtained.

One of the great features of the method for producing a norbornene-based crosslinked polymer of the present invention is in that a cured product obtained by carrying out a primary curing of the step (1) is heated to a temperature equal or higher than the deactivation temperature of the metathesis polymerization catalyst used in the step (2), to carry out a secondary curing. By carrying out the secondary curing, surprisingly, the polymer obtained has a markedly increased glass transition temperature, so that heat resistance of the norbornene-based crosslinked polymer obtained would be greatly improved.

In the step (2), a cured product obtained in the step (1) is heated to a temperature equal or higher than the deactivation temperature of the metathesis polymerization catalyst used to carry out a secondary curing.

Heating of the cured product in the step (2) is carried out at preferably a temperature 60° C. higher than the deactivation temperature of the metathesis polymerization catalyst used, more preferably a temperature 70° C. higher, and even more preferably a temperature 80° C. higher. Specific temperature ranges for the heating temperature in the step (2) are usually 250° C. or higher and lower than 350° C., preferably from 280° to 330° C., and more preferably from 300° to 310° C.

In addition, the heating time of the cured product in the step (2) is usually from 10 to 120 minutes, preferably from 20 to 90 minutes, and more preferably from 30 to 60 minutes.

Accordingly, the norbornene-based crosslinked polymer of the present invention can be obtained. The norbornene-based crosslinked polymer of the present invention has the property of highly excellent heat resistance that the glass transition temperature is 240° C. or higher. The norbornene-based crosslinked polymer of the present invention as described above has excellent heat resistance while favorably keeping other mechanical properties (for example, tensile strength, flexural strength, flexural modulus, Izod impact strength). Utilizing such properties, the norbornene-based crosslinked polymer can be used in automobile applications such as bumpers and air deflectors; construction and industrial machinery applications such as wheel loaders and power shovels; recreational applications such as golf carts and arcade game machines; medical applications such as medical instruments; industrial applications such as large-scaled panels and chairs; house facility applications such as shower pans and washbowls; and the like. In addition, the norbornene-based crosslinked polymer of the present invention is suitable as an insulation material having high heat resistance, and can be used in electric insulation applications such as electric insulation encapsulation materials and electric insulation structures; and the like. Especially, the norbornene-based crosslinked polymer of the present invention containing tricyclopentadiene-based monomer units in an amount of 50% by mass or more has not only highly excellent heat resistance but also excellent insulation property, so that the norbornene-based crosslinked polymer can be suitably used in applications that require high heat resistance and high insulation property, such as engine cover applications of automobiles and the like, electric insulation applications such as encapsulation materials for power semiconductors, and the like.

EXAMPLES

The present invention will be hereinbelow described by means of Examples, without intending to limit the present invention to these Examples. Here, unless specified otherwise, "parts" or "%" are on mass basis.

Example 1

(Preparation of Catalyst Solution)

The amount 0.6 parts of a ruthenium catalyst represented by the following formula (7) (VC843, molecular weight: 843, manufactured by Strem Chemicals) as a metathesis polymerization catalyst and 15 parts of 2,6-di-t-butyl-p-cresol (BHT,antioxidant) were dissolved in 82 parts of cyclopentanone, and thereafter 2.2 parts of 3,4-dimethylpyricline, and 0.1 parts of phenyltrichlorosilane were mixed with the solution, to give a catalyst solution.

Here, a deactivation temperature of the above ruthenium catalyst is experimentally obtained to be 220° C. The experimentation was conducted by taking measurements with DSC (differential scanning calorimeter) at a heating rate of 10° C./min, and obtaining a deactivation temperature from an exothermic peak.

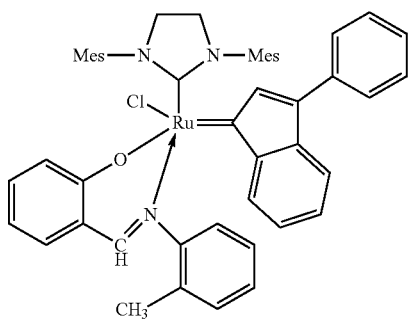

(7)

(Molding of Sample Plates)

The amount 0.5 parts of triphenyl phosphine as a polymerization retardantand 3.3 parts of a catalyst solution prepared above were added to 100 parts of dicyclopentadiene (molecular weight: 132.2) as monomers heated to 40° C., and these components were mixed to prepare a blend (solid form). Here, the amount of the metathesis polymerization catalyst used was 0.03 mmol per one mol of the entire monomers used.

As a mold, an aluminum cavity mold having internal space of length 250 mm×width 200 mm×thickness 0.5 mm was furnished, a blend obtained above was placed on the mold, and a metal plate of length 250 mm×width 200 mm was covered over the cavity mold. As a step (1), the blend was heated in a press molding machine at a temperature of 70° C. and pressure of 5 MPa for 5 minutes, to carry out a bulk ring-opening polymerization reaction, to give a cured product [step (1)].

After the above reaction, a mold temperature was immediately raised to 300° C., and kept at 300° C. for 1 hour, to carry out a secondary curing [step (2)], to give a norbornene-based crosslinked polymer.

The norbornene-based crosslinked polymer obtained had a specific gravity of 1.05 and a glass transition temperature of 259° C. Moreover, the norbornene-based crosslinked polymer obtained was subjected to each of measurements of tensile strength, flexural strength, flexural modulus, and Izod impact strength, at 23° C. The results are shown in Table 1.

Here, the above evaluations were made in accordance with the each of the methods of tensile strength (JIS K7161), flexural strength and flexural modulus (JIS K7171), and Izod impact strength (JIS K7110).

Comparative Example 1

The same procedures as in Example 1 were carried out under the same conditions except that a heating temperature in the step (2) was changed from 300° C. to 200° C., to give a norbornene-based crosslinked polymer. The norbornene-based crosslinked polymer obtained had a specific gravity of 1.04, and a glass transition temperature of 142° C. Moreover, the norbornene-based crosslinked polymer obtained was subjected to each of measurements of tensile strength, flexural strength, flexural modulus, and Izod impact strength, at 23° C. The results are shown in Table 1.

Example 2

The same procedures as in Example 1 were carried out except that tetracyclododecene (molecular weight: 160.3) was used in place of dicyclopentadiene, to give a norbornene-based crosslinked polymer. Here, the amount of the metathesis polymerization catalyst used was 0.04 mmol per one mol of the entire monomers used.

The norbornene-based crosslinked polymer obtained had a specific gravity of 1.05 and a glass transition temperature of 267° C. Moreover, the norbornene-based crosslinked polymer obtained was subjected to each of measurements of tensile strength, flexural strength, flexural modulus, and Izod impact strength, at 23° C. The results are shown in Table 1.

Comparative Example 2

The same procedures as in Example 2 were carried out under the same conditions except that a heating temperature in the step (2) was changed from 300° C. to 200° C., to give a norbornene-based crosslinked polymer. The norbornene-based crosslinked polymer obtained had a specific gravity of 1.05 and a glass transition temperature of 213° C. Moreover, the norbornene-based crosslinked polymer obtained was subjected to each of measurements of tensile strength, flexural strength, flexural modulus, and Izod impact strength, at 23° C. The results are shown in Table 1.

Example 3

The same procedures as in Example 1 were carried out except that tricyclopentadiene (molecular weight: 198.3) was used in place of dicyclopentadiene, to give a norbornene-based crosslinked polymer. Here, the amount of the metathesis polymerization catalyst used was 0.05 mmol per one mol of the entire monomers used.

The norbornene-based crosslinked polymer obtained had a specific gravity of 1.06 and a glass transition temperature of 281° C. Moreover, the norbornene-based crosslinked polymer obtained was subjected to each of measurements of tensile strength, flexural strength, flexural modulus, and Izod impact strength, at 23° C. The results are shown in Table 1.

Comparative Example 3

The same procedures as in Example 3 were carried out under the same conditions except that a heating temperature in the step (2) was changed from 300° C. to 200° C., to give a norbornene-based crosslinked polymer. The norbornene-based crosslinked polymer obtained had a specific gravity of 1.03 and a glass transition temperature of 231° C. Moreover, the norbornene-based crosslinked polymer obtained was subjected to each of measurements of tensile strength, flexural strength, flexural modulus, and Izod impact strength, at 23° C. The results are shown in Table 1.

Example 4

(Pre-Blend)

As a pre-blend for reaction injection molding, the followings were used:

Liquid A: one manufactured by RIMTEC Corporation under the trade name of "PENTAM(registered trademark) Liquid A" comprising:
a metathesis polymerization catalyst having Mo as a central atom, and a monomer component containing dicyclopentadiene as a main component.

Liquid B: one manufactured by RIMTEC Corporation under the trade name of "PENTAM(registered trademark) Liquid B" comprising:
an activator, and a monomer component containing dicyclopentadiene as a main component.

Here, when a deactivation temperature of the metathesis polymerization catalyst contained in the above Liquid A is experimentally obtained in the same manner as in Example 1, the deactivation temperature was 220° C.

(Molding of Sample Plates)

A mold for reaction injection molding for a flat plate molded article comprising a cavity mold made of plated cast steel having internal space of length 500 mm×width 500 mm×thickness 4 mm and a core mold made of forged aluminum pairing therewith were furnished, and the cavity mold was heated to 75° C., and the core mold was heated to 40° C.

Here, this mold for reaction injection molding has a structure of having a blend injection hole provided at central part of the side surfaces.

Fifty parts of Liquid A and 50 parts of Liquid B were subjected to collision mixing in a mixing head at a mixing pressure of 5 MPa, and the blend (liquid form) obtained was injected into the mold for reaction injection molding through the above injection hole at an injection rate of 0.5 kg/s, and the blend was subjected to a bulk ring-opening polymerization reaction for 90 seconds, to give a cured product [step (1)].

Thereafter, the mold temperature was raised to 300° C., and kept at 300° C. for 1 hour, to carry out a secondary curing [step (2)], to give a norbornene-based crosslinked polymer.

The norbornene-based crosslinked polymer obtained had a specific gravity of 1.06 and a glass transition temperature of 244° C. Moreover, the norbornene-based crosslinked polymer obtained was subjected to each of measurements of tensile strength, flexural strength, flexural modulus, and Izod impact strength, at 23° C. The results are shown in Table 1.

Comparative Example 4

The same procedures as in Example 4 were carried out under the same conditions except that a heating temperature in the step (2) was changed from 300° C. to 200° C., to give a norbornene-based crosslinked polymer. The norbornene-based crosslinked polymer obtained had a specific gravity of 1.05 and a glass transition temperature of 145° C. Moreover, the norbornene-based crosslinked polymer obtained was subjected to each of measurements of tensile strength, flexural strength, flexural modulus, and Izod impact strength, at 23° C. The results are shown in Table 1.

TABLE 1

|  |  | Example 1 | Comparative Example 1 | Example 2 | Comparative Example 2 | Example 3 | Comparative Example 3 | Example 4 | Comparative Example 4 |
|---|---|---|---|---|---|---|---|---|---|
| Monomer Component (Proportion in Entire Monomers) | | Dicyclopentadiene (100%) | | Tetracyclododecene (100%) | | Tricyclopentadiene (100%) | | Dicyclopentadiene (90%) Tricyclopentadiene (10%) | |
| Central Atom of Metathesis Polymerization Catalyst (Deactivation Temperature) | | Ru (220° C.) | | Ru (220° C.) | | Ru (220° C.) | | Mo (220° C.) | |
| Primary Curing Temperature | | 70° C. | 70° C. | 70° C. | 70° C. | 70° C. | 70° C. | Cavity Mold: 75° C. Core Mold: 40° C. | Cavity Mold: 75° C. Core Mold: 40° C. |
| Secondary Curing Temperature | | 300° C. | 200° C. | 300° C. | 200° C. | 300° C. | 200° C. | 300° C. | 200° C. |
| Glass Transition Temperature | (° C.) | 259 | 142 | 267 | 213 | 281 | 231 | 244 | 145 |
| Tensile Strength | (MPa) | 51 | 55 | 59 | 60 | 62 | 63 | 50 | 51 |
| Flexural Strength | (MPa) | 76 | 81 | 88 | 90 | 94 | 95 | 80 | 80 |
| Flexural Modulus | (MPa) | 2.4 | 2.0 | 2.3 | 2.1 | 3.1 | 2.8 | 2.0 | 1.9 |
| Izod Impact Strength | (kJ/m$^2$) | 5 | 7 | 13 | 16 | 3 | 4 | 28 | 31 |

It can be seen from Table 1 that while the cured products are obtained in both Examples and Comparative Examples with a heating temperature in the step (1) to be lower than a deactivation temperature of the metathesis polymerization catalyst, the glass transition temperatures of the norbornene-based crosslinked polymers obtained are largely increased in Examples by heating the products to a temperature equal to or higher than the deactivation temperature in the subsequent step (2).

Example 5

The same procedures as in Example 1 were carried out except that a mixture composed of 80 parts of tricyclopentadiene and 20 parts of dicyclopentadiene was used in place of dicyclopentadiene, to give a norbornene-based crosslinked polymer. Here, the amount of the metathesis polymerization catalyst used was 0.05 mmol per one mol of the entire monomers used.

The norbornene-based crosslinked polymer obtained had a specific gravity of 1.06 and a glass transition temperature of 281° C. Moreover, the norbornene-based crosslinked polymer obtained was subjected to each of measurements of tensile strength, flexural strength, flexural modulus, and Izod impact strength, at 23° C. Also, the confirmation of the presence or absence of the existence of bubbles in the polymer, and the measurement of one-minute withstand voltage (23° C.) of the polymer was carried out. The results are shown in Table 2.

Comparative Example 5

The same procedures as in Example 5 were carried out under the same conditions except that a heating temperature in the step (2) was changed from 300° C. to 200° C., to give a norbornene-based crosslinked polymer. The norbornene-based crosslinked polymer obtained had a specific gravity of 1.03 and a glass transition temperature of 231° C. Moreover, the norbornene-based crosslinked polymer obtained was subjected to each of measurements of tensile strength, flexural strength, flexural modulus, and Izod impact strength, at 23° C. Also, the confirmation of the presence or absence of the existence of bubbles in the polymer, and the measurement of one-minute withstand voltage (23° C.) of the polymer were carried out. The results are shown in Table 2.

Here, the confirmation of the presence or absence of the existence of bubbles was carried out by visually observing the norbornene-based crosslinked polymer obtained, and confirming the presence or absence of the existence of bubbles in the internal thereof. The measurement for one-minute withstand voltage was carried out in accordance with JIS-C2110-1(2010). Specifically, a film made of a norbornene-based crosslinked polymer and having a thickness of 0.2 mm was formed between electrodes, and voltage elevation and one-minute voltage retention were repeated until it was short-circuited between the electrodes at a measurement temperature of 23° C., and the voltage was recorded, and one-minute withstand voltage was obtained by dividing a maximum value of voltage till short-circuiting by a film thickness. Here, the film made of a norbornene-based crosslinked polymer is formed between the electrodes in accordance with the method for producing a norbornene-based crosslinked polymer of the present invention.

TABLE 2

|  |  | Example 5 | Comparative Example 5 |
|---|---|---|---|
| Monomer Component (Proportion in Entire Monomers) |  | Tricyclopentadiene (80%) Dicyclopentadiene (20%) | |
| Central Atom of Metathesis Polymerization Catalyst (Deactivation Temperature) |  | Ru (220° C.) | |
| Primary Curing Temperature |  | 70° C. | 70° C. |
| Secondary Curing Temperature |  | 300° C. | 200° C. |
| Glass Transition Temperature | (° C.) | 281 | 231 |
| Existence of Bubbles |  | None | None |
| One-Minute Withstand Voltage (23° C.) | (kV/mm) | 71 | 68 |

TABLE 2-continued

|  |  | Example 5 | Comparative Example 5 |
|---|---|---|---|
| Tensile Strength | (MPa) | 62 | 63 |
| Flexural Strength | (MPa) | 94 | 95 |
| Flexural Modulus | (MPa) | 3.1 | 2.8 |
| Izod Impact Strength | (kJ/m$^2$) | 3 | 4 |

It can be seen from Table 2 that in the norbornene-based crosslinked polymer of Example 5, obtained by using a blend containing tricyclopentadiene-based monomers in an amount of 80% of the entire monomers used, and carrying out a secondary curing at a temperature equal to or higher than the deactivation temperature of the metathesis polymerization catalyst in the step (2) has nearly the same level of one-minute withstand voltage but has a markedly increased glass transition temperature as compared to the norbornene-based crosslinked polymer of Comparative Example 5 obtained by using the same blend as the example, but carrying out a secondary curing at a temperature lower than the deactivation temperature of the metathesis polymerization catalyst in the step (2).

INDUSTRIAL APPLICABILITY

Since the polymer of the present invention has highly excellent heat resistance, the polymer can be suitably used in applications that require heat resistance such as engine cover applications for automobiles and the like, electric insulation applications, and the like.

The invention claimed is:

1. A power semiconductor wherein semiconductor elements are encapsulated with a norbornene-based crosslinked polymer comprising tricyclopentadiene-based monomers in an amount of 50% or more of the entire monomers;
    wherein the norbornene-based crosslinked polymer has a glass transition temperature of 240° C. or higher; and
    wherein said norbornene-based crosslinked polymer further comprises a filler in an amount of 10-1000 parts by mass based on 100 parts by mass of the entire monomers.

2. A method for producing a power semiconductor comprising encapsulating semiconductor elements with a norbornene-based crosslinked polymer comprising tricyclopentadiene-based monomers in an amount of 50% or more of the entire monomers,
    wherein the norbornene-based crosslinked polymer has a glass transition temperature of 240° C. or higher;
    wherein said norbornene-based crosslinked polymer further comprises a filler in an amount of 10-1000 parts by mass based on 100 parts by mass of the entire monomers.

3. The power semiconductor according to claim 1, wherein the filler is in an amount of 100-500 parts by mass based on 100 parts by mass of the entire monomer.

4. The power semiconductor according to claim 1, wherein the filler is a fibrous filler, a particulate filler or both.

5. The method for producing a power semiconductor according to claim 2, wherein the filler is in an amount of 100-500 parts by mass based on 100 parts by mass of the entire monomer.

6. The method for producing a power semiconductor according to claim 2, wherein the filler is a fibrous filler, a particulate filler or both.

* * * * *